United States Patent [19]
Kao et al.

[11] Patent Number: 6,086,676
[45] Date of Patent: Jul. 11, 2000

[54] PROGRAMMABLE ELECTRICAL INTERLOCK SYSTEM FOR A VACUUM PROCESSING SYSTEM

[75] Inventors: Yeh-Jen Kao, San Jose; Fufa Chen, Cupertino; James Chen, San Jose, all of Calif.

[73] Assignee: Applied Materials, Inc., Santa Clara, Calif.

[21] Appl. No.: 08/893,811

[22] Filed: Jul. 11, 1997

[51] Int. Cl.[7] .............................. C23C 16/00; G05B 19/00
[52] U.S. Cl. ...................... 118/695; 118/719; 364/468.28
[58] Field of Search ................................... 118/695, 719; 364/468.28

[56] References Cited

U.S. PATENT DOCUMENTS 5,525,024  6/1996  Freerks et al. ........................... 414/416
5,551,165  9/1996  Turner et al. .............................. 34/404

FOREIGN PATENT DOCUMENTS 0 530 973 A1  3/1993  European Pat. Off. .

OTHER PUBLICATIONS

Europe International Search Report Dated Nov. 11, 1998.

Primary Examiner—Richard Bueker
Attorney, Agent, or Firm—Thomason, Moser & Patterson

[57] ABSTRACT

A vacuum processing system is provided with a programmable interlock circuit for combining the interlock signals generated by the system into combined interlock signals. The programmable interlock circuit uses a matrix of switches to select which interlocks will be combined to form which combinations. The interlock signals are formed by two lines that are shorted together when the interlock signal is okay and not shorted together when the interlock signal is not okay. When the two lines are shorted together, then they activate a relay to send a signal in a line of relays, each of which is activated by a different interlock signal. The matrix of switches short out the relay switches in order to deselect one interlock input for one interlock output. Each interlock signal is associated with an LED for visual indication of whether the interlock is okay. Likewise, each combined interlock signal is associated with an LED for visual indication of whether the combination of interlocks is okay. Additionally, each interlock signal is associated with a defeat circuit wherein a jumper may defeat the interlock signal for every combination. Each defeat circuit is provided with an LED for visual indication of whether the interlock is defeated.

16 Claims, 7 Drawing Sheets

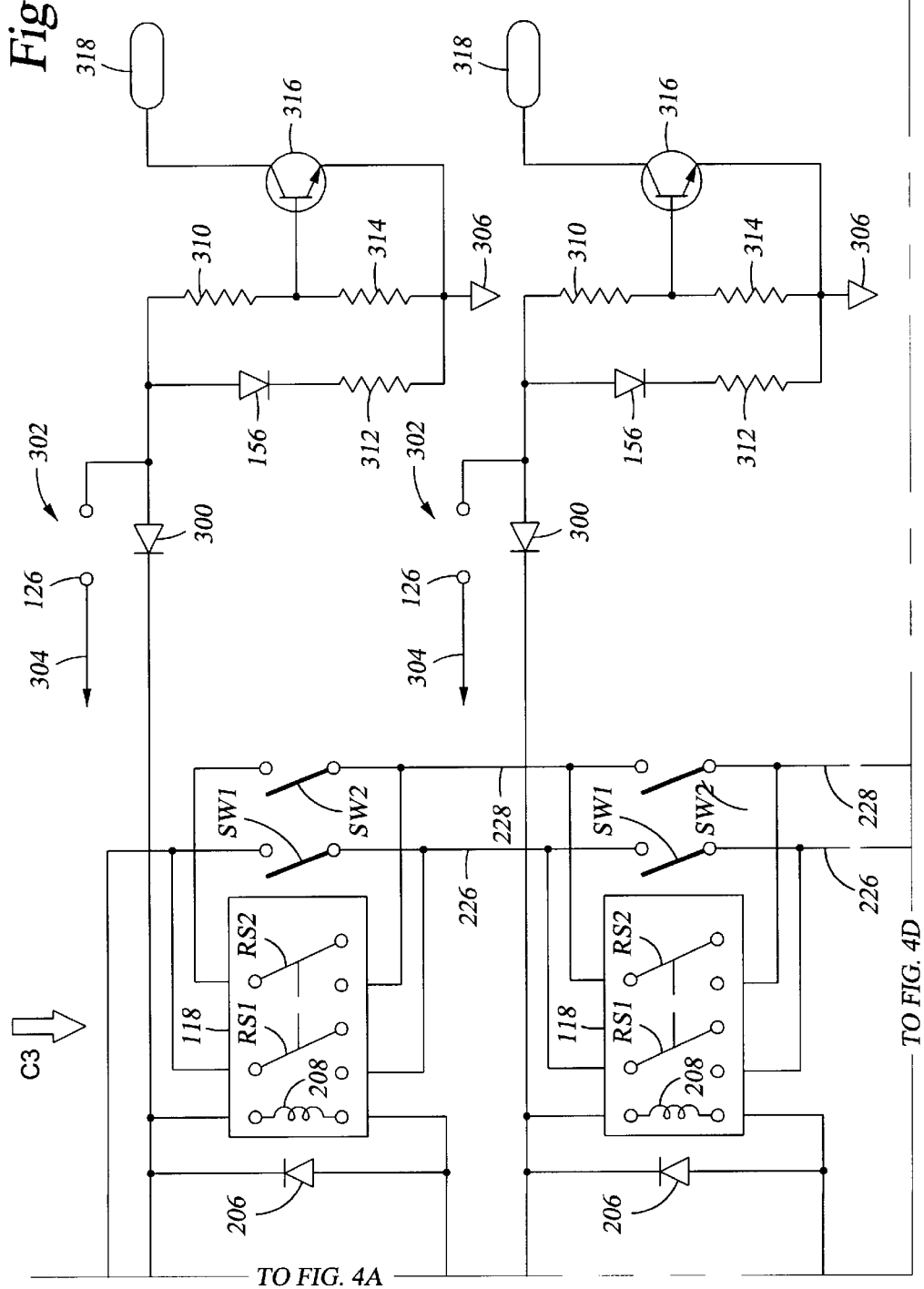

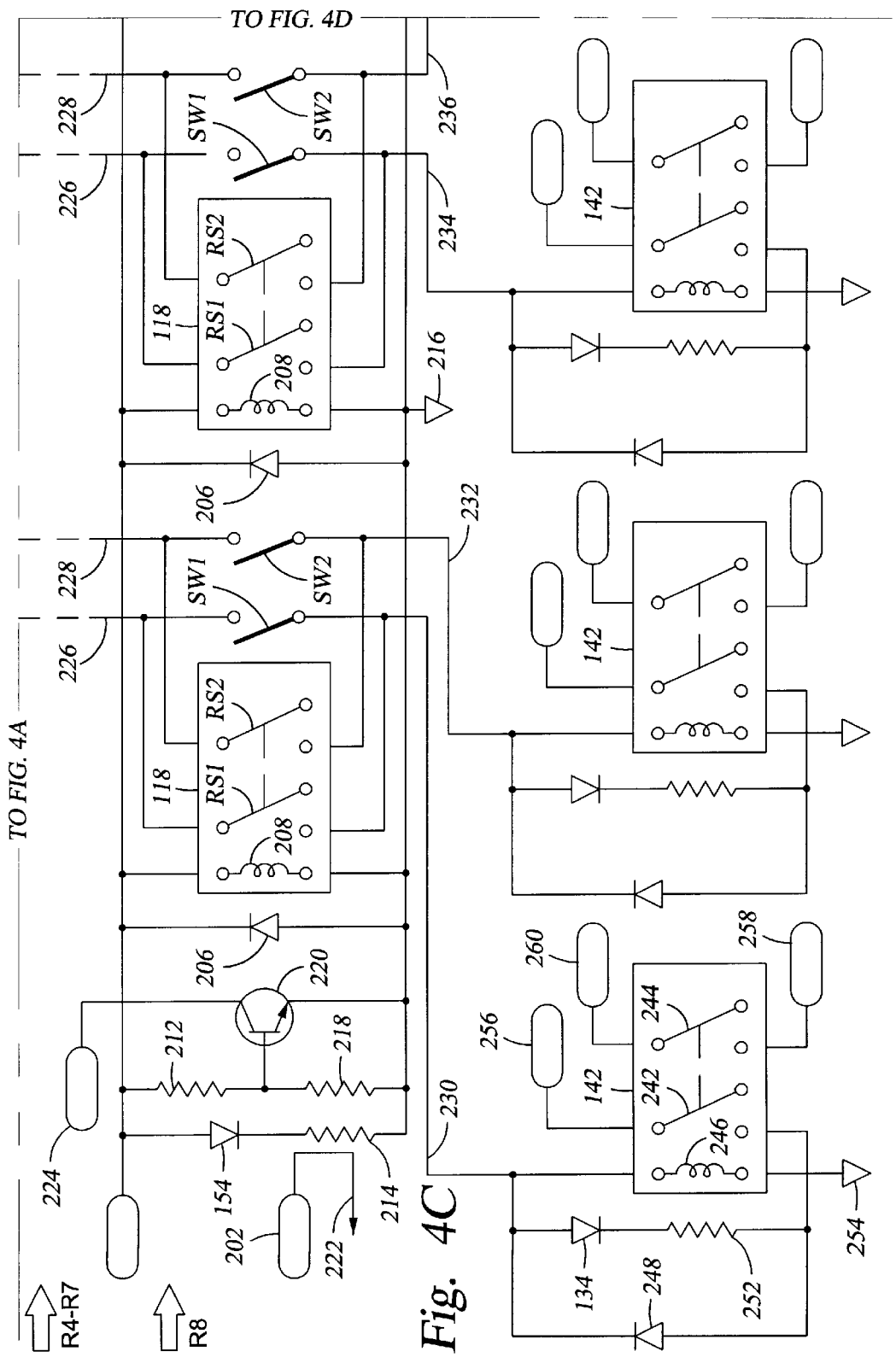

PROGRAMMABLE ELECTRICAL INTERLOCK SYSTEM FOR A VACUUM PROCESSING SYSTEM

FIELD OF THE INVENTION

This invention generally relates to interlock systems for vacuum processing systems. More specifically, this invention relates to a programmable interlock system by which interlock outputs can be reconfigured by changing the selection of interlock inputs.

BACKGROUND OF THE INVENTION

Generally, vacuum systems for manufacturing integrated circuits on wafers are known. A vacuum system typically includes a centralized vacuum chamber, called a transfer chamber, for transferring wafers from a wafer cassette to one or more process chambers. The entire system, including the transfer chamber, load lock chambers and process chambers, is referred to as a cluster tool. A vacuum system may also typically have some kind of subsystem, such as a mini-environment, for delivering wafers to one or more load lock chambers and the into the transfer chamber where the wafers can be moved into one or more process chambers. After the wafers are processed, they are moved back through the load lock chamber and into wafer cassettes where the wafers can be moved to the next system for additional processing.

A vacuum processing system has various operating parameters, conditions and functions that are carried out by the various chambers within the system and the devices within and connected to these chambers. Such devices may be valve door actuators, heaters, vacuum pumps, vacuum valve actuators, gas valve actuators, temperature meters, pressure meters, wafer position sensors, door position sensors, robot motors, and a whole host of other devices that may be used in a vacuum processing system. Some of the functions or possible conditions or states of these and other devices make it impossible or dangerous for some other devices or parts of the system to perform their functions or to be in certain conditions or states.

For example, a transfer chamber typically has a removable lid. When this lid is removed, gases may escape from the transfer chamber into ambient air or vice versa. Process chambers attached to the transfer chamber, however, may be kept at a vacuum while the transfer chamber's lid is open, so a valve door that seals a valve opening between the transfer chamber and process chamber must be closed to prevent loss of the vacuum. Additionally, the process chamber may be using a toxic gas to perform its process, and the toxic gas may be harmful if it were to escape into ambient air. Therefore, when the lid of the transfer chamber is removed, it is important for the transfer chamber to lock out the valve door actuator from removing the door from the valve opening, so the toxic gas won't escape. The signals that a vacuum system uses to prevent such a disastrous occurrence are called interlocks. Interlock signals are sent between devices, or subsystems to prevent certain functions or conditions.

Another example of an interlock requirement when the transfer chamber lid is open is that the gas flow to the chamber should be turned off. Additionally, any vacuum line to the chamber should be turned off. If the chamber has a heater, it should be turned off, too.

Another interlock example is that if an over-temperature condition is detected in a chamber, then any heater in that chamber should be turned off. Likewise, if cooling water flow to a chamber is stopped, then the heater should be turned off, since the chamber may, otherwise, soon unacceptably heat up.

In still another interlock example, if a pump for a chamber has failed, then the gas flow to the chamber should be turned off.

There are many other examples of interlock requirements known to the vacuum processing industry.

The interlock signals are not sent directly from a device that generates an interlock to a device that receives the interlock. Instead, two or more of the generated interlocks are hardwired together to create a single combined interlock output that is then sent to the receiving devices. Thus, space within the system is economized. For example, a system that has six generated interlock signals may combine them into just two interlock output signals for sending to the receiving devices. The interlocks may be combined in this manner because many of the receiving devices will have the same response to the different interlock signals, as illustrated in the above examples.

An interlock signal typically is generated by a mechanical interlock switch associated with a particular device. For example, a chamber has a switch that is tripped by the chamber's lid when the lid closes, so when the lid opens, the switch opens, providing an interlock signal that the lid is open. Where needed, a chamber also has a thermostat switch that opens to provide an interlock signal indicating that the temperature has become too hot in the chamber. A system has a switch that opens to provide an interlock signal indicating a failed impedance matching box, which cancels the imaginary portion of the impedance of a chamber in order to match it with the impedance of the generated RF signal. The system also has a pressure-sensitive switch that opens to provide an interlock signal indicating that the pressure has become greater than ½ atmosphere in a chamber.

The inputs provided to the hardwired interlock circuitry are single lines from each interlock switch providing a voltage signal, such as +24V, when the switch is closed or providing an open circuit when the switch is open. The interlock input signals are hardwired to a series of relay switches. The relay switches are activated by the voltage signal to pass a signal that activates an output relay switch. When activated, the output relay switch sends an output voltage signal on a single line as the output provided by the hardwired interlock circuitry. When all of the interlock switches are closed, then the generated voltage signal will close all of the relays in the series, thus providing the output relay with the signal to close it, and the output line will carry the output voltage signal. When any one of the interlock switches is open, then the corresponding relay switch in the series will not receive the voltage to activate it, so the output relay will not receive the signal to close it, and the output line will not carry the output voltage signal, but rather will present an open circuited line.

A problem with this method of combining interlock signals is its lack of flexibility. Since the generated interlocks are hardwired together, there is no way to reconfigure the combinations. Thus, a device that doesn't have the exact same combination of interlock requirements as those that are hardwired together will have to accept a combined interlock signal that includes more than the device's actual requirement for generated interlock signals. It is not possible to reconfigure any of the combined interlock signals to provide only those generated signals that the device needs, so the device may receive an interlock that it doesn't need. This event may cause the device to shut down when it doesn't need to. Powering the device back up to operating conditions may cause a delay in the overall system processing. For example, if the device is a heater, then it will have to return to operating temperature before processing can continue.

Another problem with interlock systems is the lack of a means to defeat an interlock so it won't interfere during troubleshooting or testing of a vacuum system. In such a situation, an operator may want to turn on only a portion of the vacuum system in order to test its operation, but without the interference of another part. For example, under normal operating conditions, the removal of a chamber lid may cause an interlock to turn off a heater inside the chamber. If the operator wants to see how the heater is working, then the operator may need to open the lid without turning off the heater, so the operator may observe the operation of the heater. This technique is not possible under current designs for combining interlocks.

Another problem with interlock systems is the lack of any feedback to the operator showing where the interlock signal came from. The operator sometimes must go through an extensive troubleshooting procedure to determine which device generated the interlock signal, especially when several generated interlock signals are hardwired through one combined output.

Thus, a need has arisen for an electrical interlock system that permits reconfiguration of the interlock combinations and permits an interlock to be defeated and provides interlock feedback to an operator.

SUMMARY OF THE INVENTION

A vacuum processing system has a programmable interlock circuit for combining the interlock signals generated by various parts of the system into the combined interlock signals used by various other parts of the system to control their functions. The programmable interlock circuit has a combination circuit with a series of switches to select which interlocks will be combined to form which combinations. Each combination of interlocks has its own combination circuit. The switches enable or disable corresponding relay switches in a set of relays.

The combined interlock outputs are generated by output relays. Each output relay is activated by a voltage signal. Each voltage signal must pass through each corresponding relay switch or select switch in the line of the combination circuit. If any selected relay switch is open, then the voltage will not pass through, so the output relay will not be activated, thus indicating that one of the interlock signals in the combination was not okay.

The interlock signals are formed by two lines that are shorted together with a switch when the interlock signal is okay and not shorted together when the interlock signal is not okay. When the two lines are shorted together, they activate their corresponding relays to pass the voltage through in each line of relays. The relays in each line are each activated by a different interlock signal.

The select switches form an m×n matrix of switches. Each switch representing the connection of one of m interlock inputs with one of n interlock outputs. The matrix of switches shorts out the relay switches in order to deselect one interlock input for one interlock output.

Each interlock signal is associated with an LED for visual indication of whether the interlock is okay. Likewise, each combined interlock signal is associated with an LED for visual indication of whether the combination of interlocks is okay.

Additionally, each interlock signal is associated with a defeat circuit wherein a jumper may defeat the interlock signal for every combination, so the interlock signal will have no effect. Each defeat circuit is provided with an LED for visual indication of whether the interlock is defeated.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 4A–D are a schematic of the circuitry for the programmable interlock system.

DETAILED DESCRIPTION OF A PREFERRED EMBODIMENT

A programmable interlock circuit according to the preferred embodiment of the invention has a set of switches for selecting each interlock input that is to be combined for each interlock output. The inputs are each the set of two wires connecting to the interlock switches in the interlock generating devices, instead of the single-line inputs from the prior art. Likewise, the outputs are each two wires which are shorted together by a relay switch if the interlocks are all okay and open-circuited if any of the interlocks are not okay. A green LED associated with each input and each output lights up to indicate that the corresponding interlocks are okay. A set of jumpers may defeat an input for all outputs by inserting a jumper in the circuit. A yellow LED associated with each jumper lights up to indicated that the corresponding jumper has defeated the corresponding input.

Figure 1:
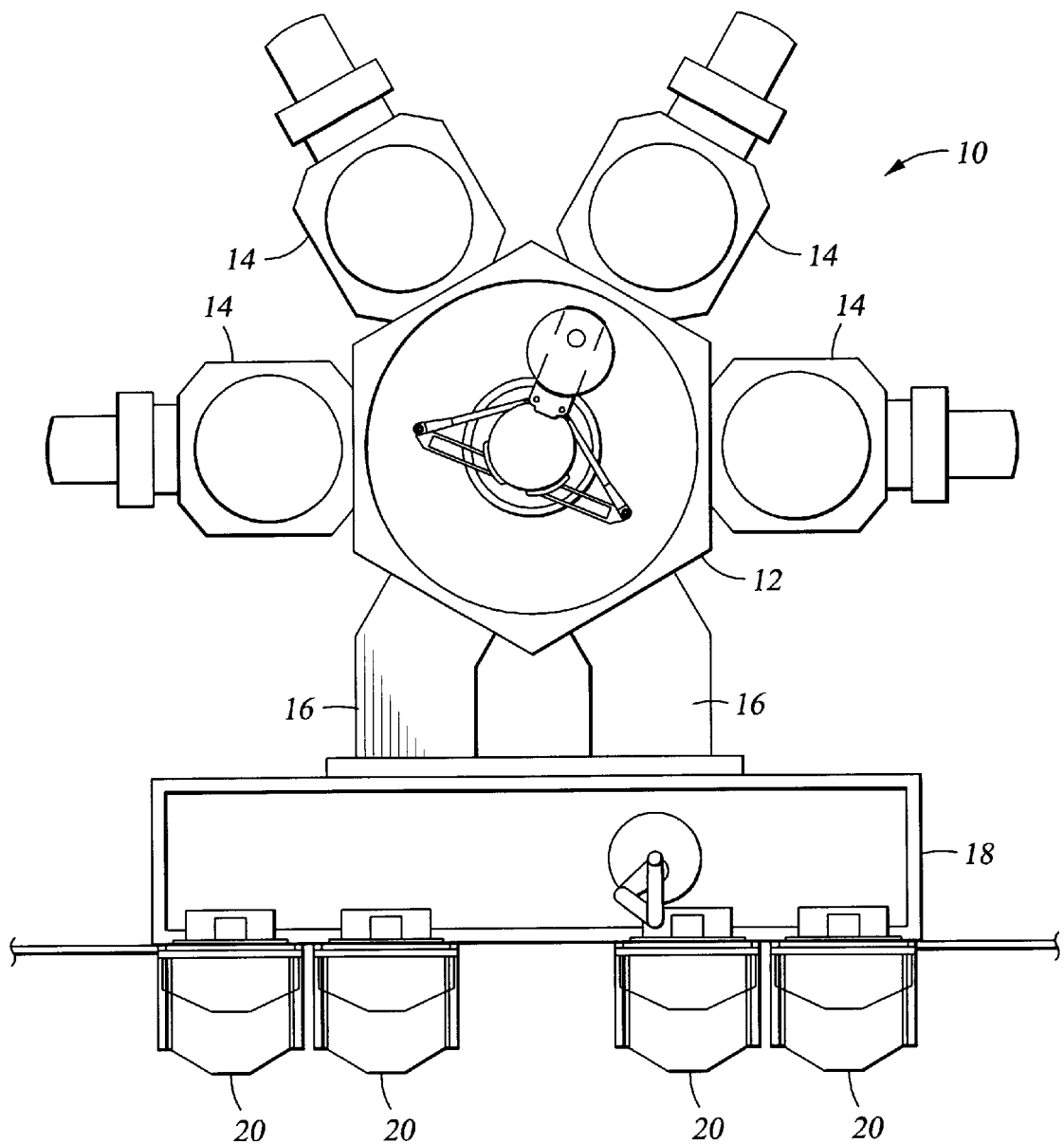
FIG. 1 is a schematic top view of a vacuum processing system incorporating the present invention.

FIG. 1 is a top schematic view of a vacuum processing system 10, which may incorporate the present invention, generally showing a series of vacuum processing chambers 14 attached to a central vacuum transfer chamber 12. A pair of vacuum load lock chambers 16 are shown providing a passageway from a mini-environment 18 into the transfer chamber 12. Pod loaders 20 are shown attached to the mini-environment 18 for receiving wafer cassettes for introduction of wafers into the system.

In this arrangement, the vacuum chambers 14 are connected to the transfer chamber 12 forming an airtight seal which permits wafers to pass between the chambers 12, 14 while maintaining the vacuum in the chambers 12, 14. The chambers 12, 14 typically are further connected by tubings, conduits and wiring for all of the facilities and electrical communications that the transfer chamber 12 provides to the chambers 14.

The pod loaders 20 may have cassettes of wafers placed in them by a person or by an automated machine that is part of the over-all manufacturing system of the manufacturing plant or building that houses vacuum system 10. A robot (not shown) within the mini-environment 18 moves the wafers from the pod loaders 20 to the load lock chambers 16 and back again. A robot (not shown) with an arm and a blade is disposed within the transfer chamber 12 to move the wafers from one chamber to another.

Vacuum chambers 14 may be any of several types of process chambers, such as physical vapor deposition (PVD) chambers, chemical vapor deposition (CVD) chambers, etch chambers, etc., for performing the various processes in the series of processes for manufacturing integrated circuits on wafers. It is not unusual for a manufacturer of vacuum chambers to have over twenty different types of such process chambers for performing different processes on the wafers.

Various parts of vacuum processing system 10 have many of the interlock requirements known in the semiconductor industry as described above. The interlock signals generated by various parts of the system 10 are routed to the programmable printed circuit board 100 shown in FIG. 2. The PCB 100 is inserted into the known control system for a vacuum processing system 10. In this embodiment, eight generated interlock inputs and six combined interlock outputs are shown. It is to be understood, however, that the invention contemplates any number of inputs and outputs.

Examples of devices that may generate interlock inputs are: a chamber lid, the impedance matching box, the one-half atmosphere indicator, an over-temperature indicator, a water pump failure sensor, or the like. Examples of devices that may receive interlock outputs are: a heater driver, an RF generator, a chamber gas valve controller, an auxiliary gas valve controller, or the like.

Figure 2:
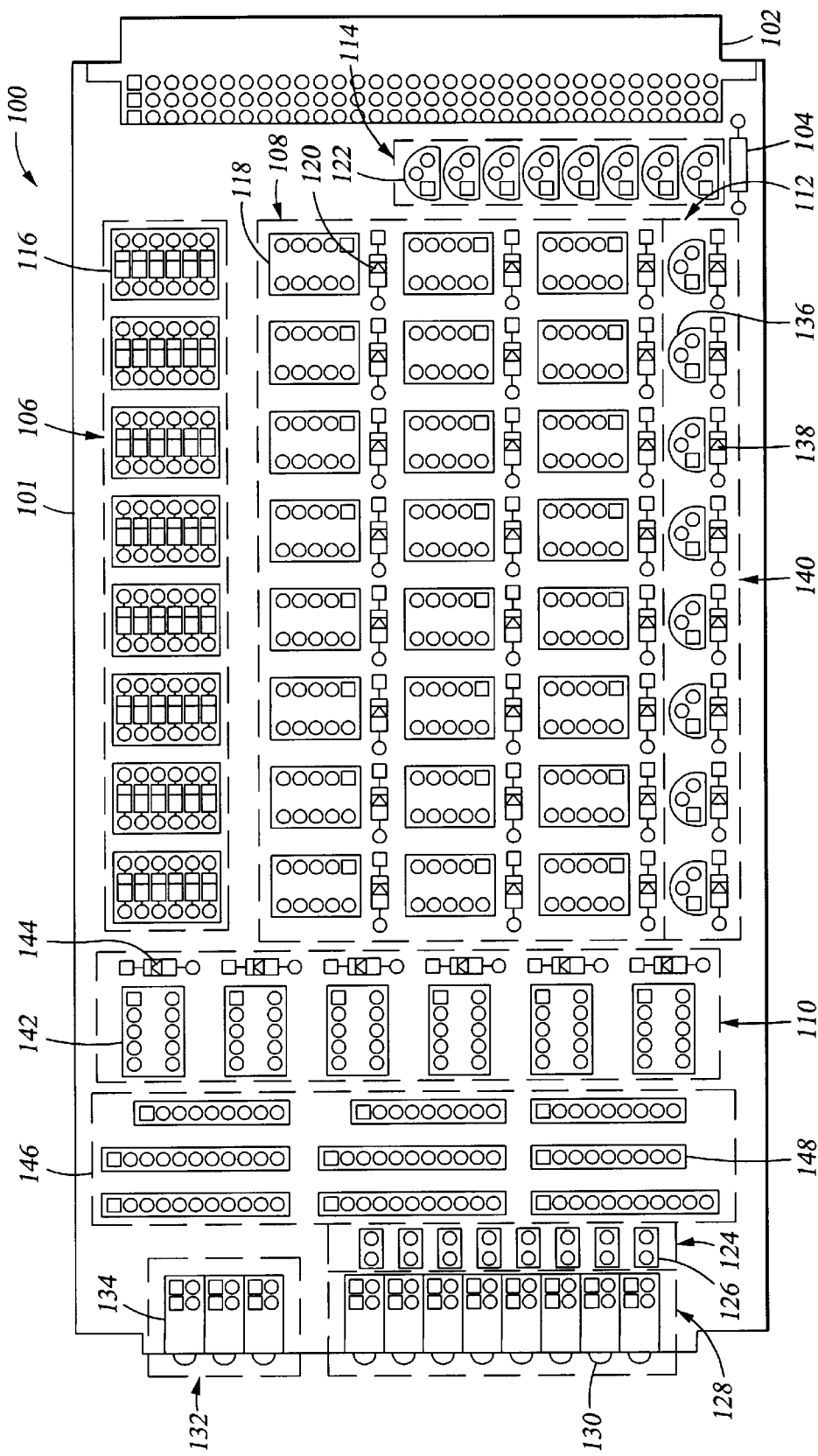
FIG. 2 is a board layout for a printed circuit board for a programmable interlock system for a vacuum processing system.

FIG. 2 shows a board layout for one embodiment of the programmable PCB 100. PCB 100 includes a board 101 onto which all of the elements are mounted. The function of each element in the board layout will be described with reference to the schematic diagram of the circuit shown in FIGS. 4*a* and *b*. Edge connector 102 connects to the system controller for sending and receiving all signals, including the generated interlocks, the combined interlocks, electrical power, ground, etc. An electrical power source, such as a +24V source, connects to the rest of the PCB 100 through fuse 104.

A bank 106 of eight DIP switches 116, each having six switches, thus forming an 8×6 matrix, is provided for programming the PCB 100. Each DIP switch 116 corresponds to one of the interlock inputs, and the six switches on each DIP switch 116 each corresponds to one of the six interlock outputs. Thus, each individual switch of each DIP switch 116 corresponds to a particular input/output coupling, meaning that each individual switch determines whether an input is selected to affect an output. In this embodiment, when a switch is turned on, then the corresponding interlock input is inactivated, meaning that this interlock input is not selected to affect the status of the corresponding interlock output. On the other hand, when the switch is turned off, then the input is activated, so the input is selected to be one of the inputs combined to create the interlock output.

A bank 108 of 24 relays 118, each paired with a diode 120, is provided for combining the eight interlock inputs through a corresponding set of three relays 118. Each relay 118 provides a combination function for two interlock outputs, thus continuing the 8×6 matrix of circuits for combining the eight inputs into the six outputs. Each set of three relays 118 is paired with a corresponding transistor 136 of transistor bank 112 to provide the interlock input to the system controller through edge connector 102.

A relay bank 110 of six relays 142, each paired with a diode 144, is provided for receiving the combined interlock signals and for providing the interlock output okay signal or not-okay signal to the system controller through the edge connector 102. An okay signal indicates that an interlock event has not occurred, so the system may operate normally. A not-okay signal indicates that an interlock event has occurred, so the appropriate response must be taken, such as shutting the system down to prevent an unsafe condition or prohibiting the opening of the chamber lid to prevent toxic gases from escaping.

A bank 124 of eight jumpers 126 is provided for defeating the eight interlock inputs. By attaching a jumper, the operator can defeat a corresponding interlock input. If the jumpers 126 are not accessible when the PCB 100 is installed in the system controller, then the PCB 100 may be removed from the controller in order to attach or detach a jumper 126. In cooperation with a corresponding transistor 122 in transistor bank 114, the defeat condition is communicated to the system controller through edge connector 102. In cooperation with a corresponding diode 138 in diode bank 140, the defeat condition is communicated to the corresponding set of three relays 118 to prevent the relays 118 from providing an interlock not-okay signal through to the interlock outputs.

A bank 128 of eight rows of two display LED's 130 (shown in FIG. 3) provides a status indication to the operator for whether a corresponding interlock input is okay or not-okay, and defeated or not-defeated. Another bank 132 of three rows of two LED's 134 (shown in FIG. 3) provides the status indication to the operator for whether a corresponding interlock output is okay or not okay.

Figure 4A:
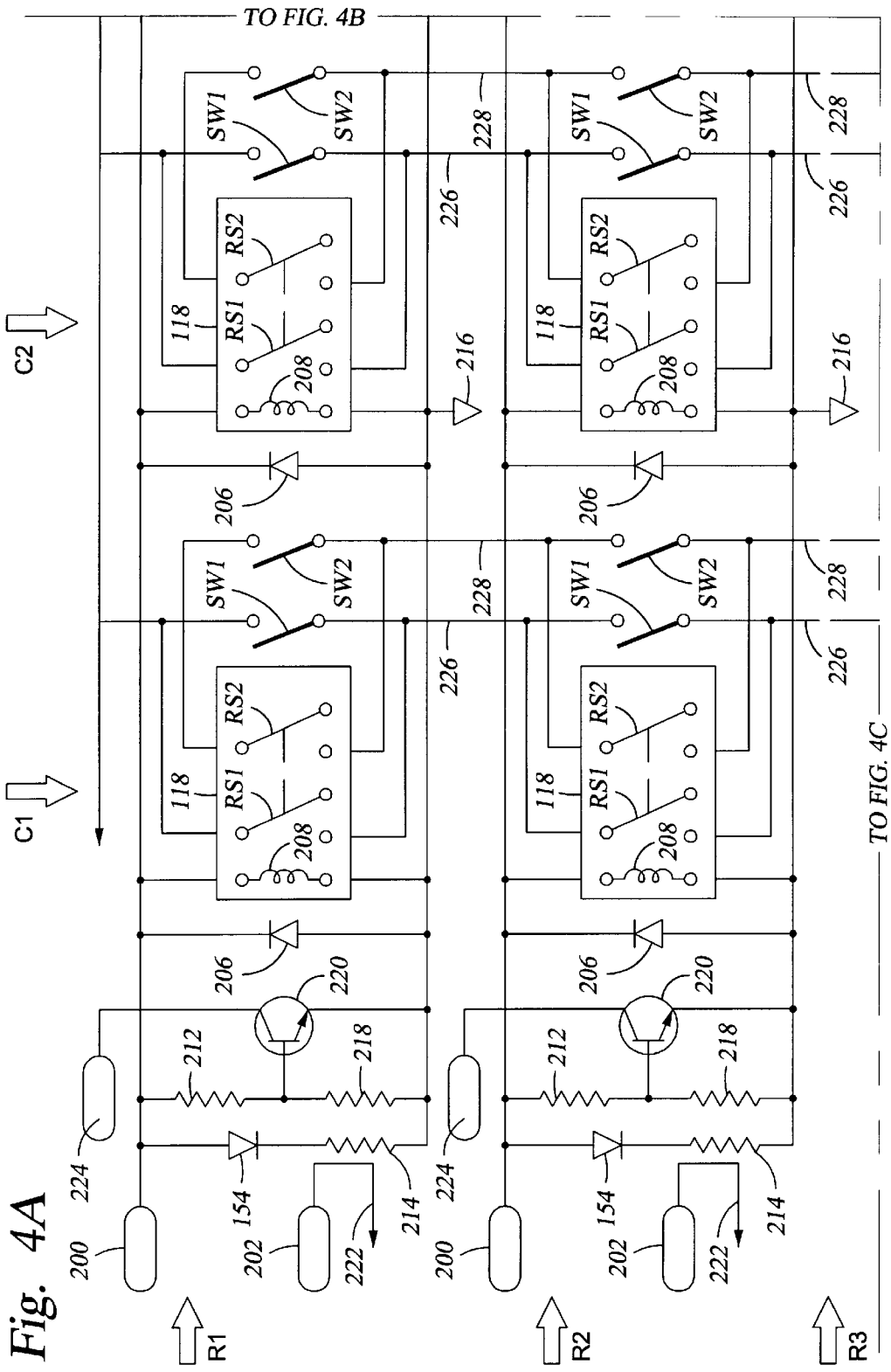
Figure 4D:
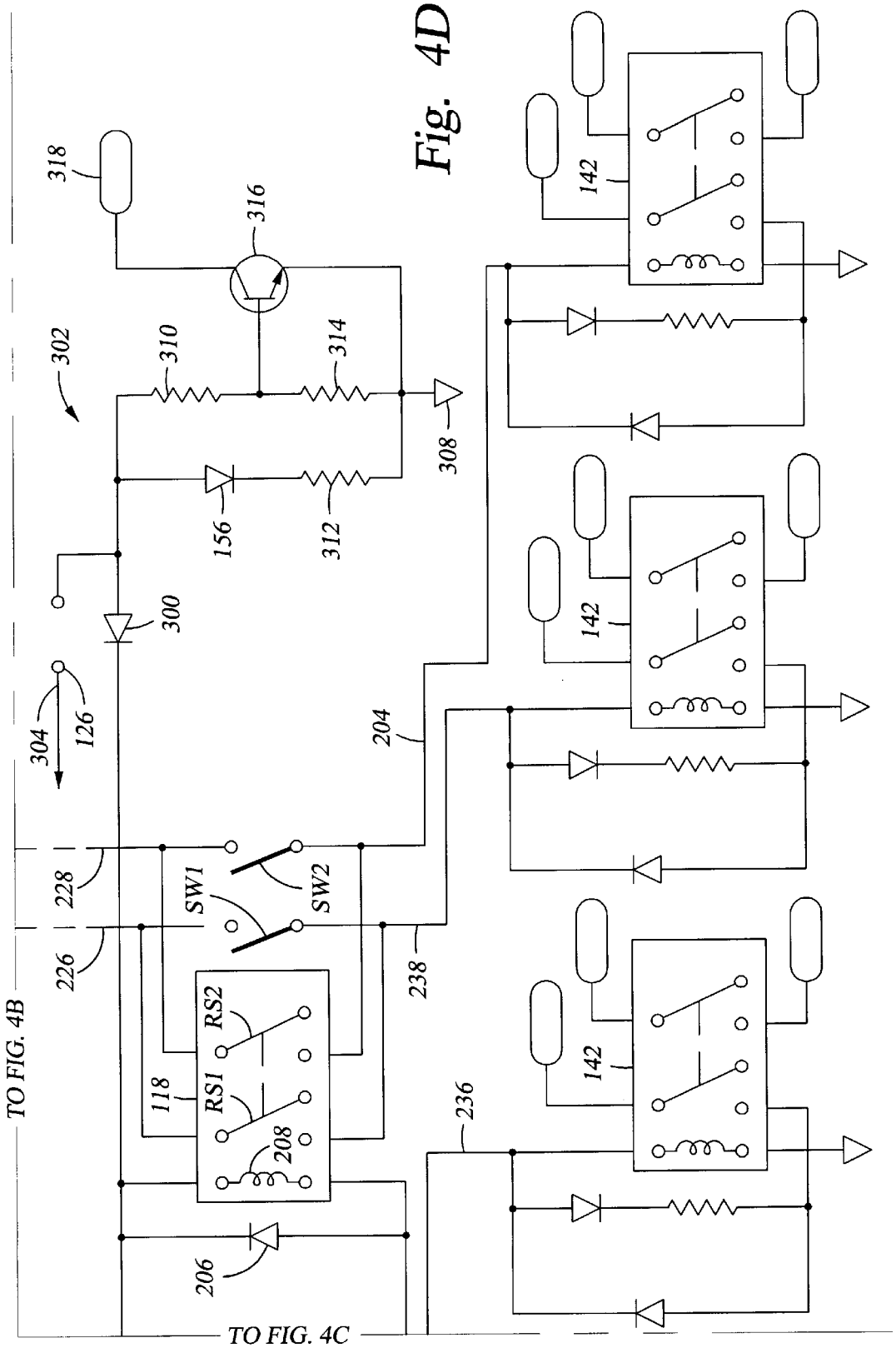

A resistor bank 146 is provided for supplying the resistors 148 shown in FIGS. 4*a* and *b*.

Figure 3:
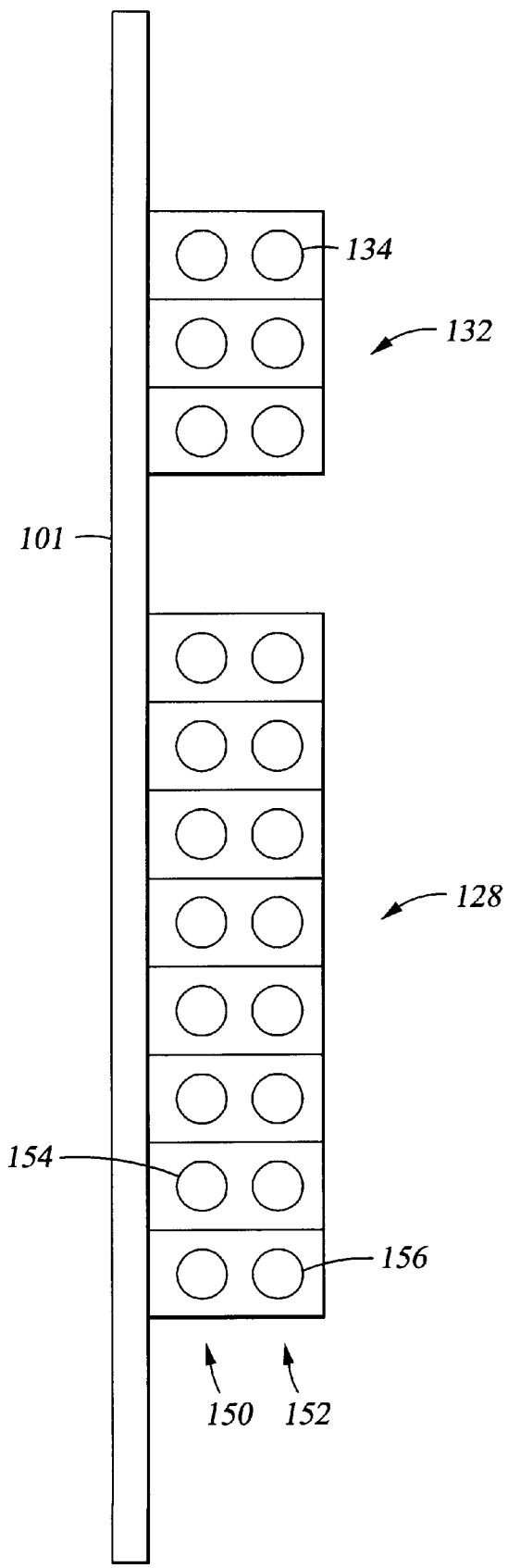
FIG. 3 is an arrangement of light emitting diodes indicating status for outputs and inputs for the printed circuit board.

FIG. 3 shows the front view of the LED indicators described above. LED bank 128 is attached to board 101 and includes a green LED column 150 and a yellow LED column 152. The LED's 154 of green LED column 150 indicate whether the interlock input status is okay or not-okay. If a green LED 154 is on, then the status of the corresponding interlock input is okay. The LED's 156 of yellow LED column 152 indicate whether the interlock input is defeated by a corresponding jumper 126 placed in jumper bank 124. If a yellow LED 156 is on, then the input is defeated.

LED bank 132 is attached to board 101 and includes six green LED's 134. The green LED's 134 indicate whether a corresponding interlock output is okay. If a green LED 134 is on, then the corresponding interlock output is okay.

FIGS. 4*a* and *b* show a schematic diagram for the programmable interlock circuit for the embodiment described above. The relays 118 of relay bank 108 are shown arranged in eight rows R1–R8 corresponding to the eight interlock inputs, and three columns C1–C3, wherein each relay 118 has two relay switches RS1 and RS2, so the columns correspond to the six interlock outputs. Each relay switch RS1, RS2 is normally off, so no current is conducted therethrough until the relay is activated. These relay switches RS1, RS2 are the switches that combine the individual interlock signal inputs into combined interlock signal outputs.

Each relay 118 is associated with a pair of switches SW1, SW2 and a diode 206. Thus, each row R1–R8 has six switches SW1, SW2 corresponding to the six switches in each DIP switch 116 of bank 106. Each associated relay 118, pair of switches SW1, SW2 and diode 206 forms the combination circuitry for combining one interlock input with one, both or neither of two interlock outputs, as described below. These switches SW1, SW2 are the switches that select which individual interlock signal inputs will be combined into the combined interlock signal outputs.

Each relay switch RS1, RS2 is activated by inductor 208. Thus, each row R1–R8 has six relay switches RS1, RS2. Each relay switch RS1, RS2 is paired with one of the switches SW1, SW2 that is associated with its relay 118 in order to enable or disable each relay switch RS1, RS2. For example, relay switch RS1 in row R1 and column C2 is paired with switch SW1 in the same row and column. The switches SW1, SW2 deselect the individual interlock signal inputs by closing, thus shorting out the corresponding relay switches RS1, RS2, so the relay switches RS1, RS2 have no effect on the combined interlock signal outputs. Additionally, each switch/relay-switch pair is connected through lines 226, 228 to the next switch/relay-switch pair in the next row. Lines 226, 228 for each column of row R5 in FIG. 4a connect to lines 226, 228 for each matching column of row R6 in FIG. 4b. The last switch/relay-switch pair is connected through one of the lines 230–240 to an output relay 142 in relay bank 110 corresponding to an interlock output. For example, all of the switch/relay-switch pairs SW2/RS2 in each row R1–R8 of column C2 are connected in series through line 236 to a relay 142.

Each row R1–R8 has a pair of wires 200, 202 connected to pins on edge connector 102 providing the interlock inputs. In other words, each interlock input is delivered by a pair of wires. In this embodiment, when the wires 200, 202 are shorted together by an interlock switch on the interlock generating device, the interlock input status is indicated as okay, which means that the device is functioning normally. When the pair of wires 200, 202 are not shorted together, but rather are open, then the interlock input status is considered as not-okay, which means that the interlock condition for the corresponding device has occurred, such as the chamber lid is open, or the vacuum pump has failed, or the temperature is too high, or the water flow has stopped, etc.

Each wire 202 is tied to a particular voltage 222, such as +24V, supplied by the PCB 100. Wire 200 is not tied to any voltage, unless it is shorted to wire 202. The input from each wire 200 is provided to a light emitting diode 154 and a resistor 212 in each row R1–R8. Each LED 154 is one of the green LED's 154 of LED bank 128 (FIGS. 2 and 3). The input from each wire 200 is also provided to the diode 206 and the inductor 208, the other electrodes of which are connected to a reference voltage 216. Each LED 154 is in series with a resistor 214 to reference voltage 216. Each resistor 212 connects to another resistor 218 and the base of a transistor 220. Each resistor 218 and the emitter of each transistor 220 is connected to the reference voltage 216. The collector of each transistor 220 is connected to an output pin 224 on edge connector 102.

Voltage 204, such as +24V, is applied to the first switch/relay pairs in each column C1–C3 and is controlled by each of the switches and relays in a column. If either the switch or relay switch in a given pair is closed, then voltage 204 is passed through to the next pair in the column. On the other hand, if both the switch and the relay switch in the pair are open, then the voltage 204 does not pass through to the next pair in the column.

When a switch SW1, SW2 in a given row/column is open, i.e. when it is turned off, then the corresponding relay switch RS1, RS2 controls whether the voltage 204 is passed on to the next switch/relay-switch pair in the next row. On the other hand, when a switch SW1, SW2 in a given row/column is closed, i.e. when the switch is turned on, then the state of the corresponding relay switch RS1, RS2 does not matter because the voltage will always be passed on to the next row by the closed switch SW1, SW2.

When a given interlock is okay so its pair of wires 200, 202 in the corresponding row R1–R8 is shorted together, then voltage 222 is applied through wire 200. Voltage 222 at wire 200 will forward bias the corresponding LED 154 and reverse bias each of the diodes 206 in the row. Thus, current will flow through LED 154 to resistor 214 causing a potential drop to be fixed across resistors 212, 218 and each inductor 208. The voltage across resistors 212, 218 will turn on transistor 220 causing the reference voltage 216 to be applied to output pin 224, thus indicating to the system controller that the interlock is okay. The voltage across each inductor 208 in the row will activate each of the relay switches RS1, RS2. Thus, voltage 204 will be applied through each relay 118 in the row. Therefore, when an interlock input signal is okay, then each relay in the corresponding row will close the circuit for the voltage to pass through to the next row. If the interlock inputs for all of the rows R1–R8 are okay, then every relay will pass the voltage 204 down through the chain of relays 118 until it reaches relays 142 in relay bank 110. Additionally, the forward biased LED 154 will present a green light providing a visual indicator to the operator that the interlock input is okay.

When a given interlock is not okay, and its pair of wires 200, 202 in the corresponding row R1–R8 is not shorted together, then no voltage is applied through wire 200. Thus, the reference voltage 216 will reverse bias the LED 154 and forward bias each diode 206 in the row, effectively shorting out the inductors 208 and the resistors 212, 218. Thus, resistors 212, 218 will not turn on transistor 220, so no voltage will be seen at corresponding pin 224, indicating to the system controller that the interlock is not okay. Likewise, inductors 208 will not activate relay switches RS1, RS2, so the voltage 204 will not be applied through the relays 118 of the row. Instead, switches SW1, SW2 will control whether the voltage 204 is applied through to the next switch/relay-switch pair of the next row. Additionally, the reverse biased LED 154 will not present a light, visually indicating to the operator the interlock input that is not okay.

With the above-described combination circuitry, the operator may program which interlock inputs are combined to form which interlock outputs. By turning a given switch SW1, SW2 on, the corresponding relay switch RS1, RS2, activated by the interlock input, will have no effect on the output. Only by turning the switch SW1, SW2 off, will the corresponding relay switch RS1, RS2 have any effect on the output. Thus, the operator selects which interlock inputs to combine into one interlock output by turning off their corresponding switches SW1, SW2.

For example, if the first input is a chamber-lid interlock input, and the second input is a match interlock input, and the third input is a ½-atmosphere interlock input, and the fourth input is an over-temperature interlock input, and the fifth input is a water-flow-stopped interlock input, and the sixth input is a pump-failed interlock input, and the seventh and eighth inputs are not used, and if the operator wants the heater driver to shut off when any one of the chamber-lid interlock, the ½-atmosphere interlock, the over-temperature interlock, or the water-flow-stopped interlock is not okay, and if the first interlock output is to be used for the combined interlock signal; then the operator will select the first, third, fourth and fifth inputs for the first output by turning off the first switch in the first, third, fourth and fifth DIP switches 116 in bank 106, so the corresponding relay switches may control. The first switches in the rest of the DIP switches 116 will be turned on in order to bypass their interlock inputs. In other words, the switches SW1 in column C1 will be open in rows R1, R3, R4 and R5, while the switches SW1 in column C1 will be closed in rows R2, R6, R7 and R8.

In this example, if the over-temperature interlock becomes not okay, and the pump-failed interlock becomes not okay, while all of the rest of the interlocks are okay, then all of the following will happen in column C1. In row R1: wire 200 will be shorted to wire 202, so voltage 222 will be applied to inductor 208, which will activate relay switch RS1 by closing it, so voltage 204 will be applied through to row R2. In row R2: since switch SW1 is closed, the status of wire 200 doesn't matter, and the voltage 204 will be applied through to row R3. In row R3: relay switch RS1 will be closed, as in row R1, and voltage 204 will be applied through to row R4. In row R4: since the interlock is not okay, there is no voltage on wire 200, so inductor 208 has no voltage across it, so relay switch RS1 is not activated, so both switch SW1 and relay switch RS1 are open, so voltage 204 does not proceed to row R5. In row R5: relay switch RS1 will be closed, so if voltage 204 had not been stopped at row R4, then it would have been applied through to row R6. In row R6: even though the interlock is not okay, since switch SW1 is closed, voltage 204 would have been applied through to row R7 if it had not been stopped at row R4. In rows R7 and R8: since the switches SW1 are closed, voltage 204 would have been applied through line 230 to relay 142 if it had not been stopped at row R4. The end result is that no voltage is applied through line 230 to relay 142, whose function will be described next.

The relays 142 each have two relay switches 242, 244 activated by an inductor 246. Lines 230–240 connect to each inductor 246 of their respective relays 142 and to diodes 248, 134. Each diode 134 is one of the green LED's 134 of LED bank 132 and connects in series with a resistor 252. Each inductor 246, diode 248, and LED/resistor series 134/252 connect in parallel to a reference voltage 254. Each reference voltage 254 also connects to the switch 242 of its respective relay 142, so that when switch 242 is activated, reference voltage 254 is applied to pin 256, a pin on edge connector 102. A reference voltage 254 applied to any pin 256 indicates to the system controller that the corresponding interlock output is okay. Each pair of interlock output pins 258, 260 is connected through a respective relay switch 244; such that when a switch 244 is activated, the corresponding pins 258, 260 are shorted together; and when the switch 244 is not activated, the corresponding pins 258, 260 present an open circuit.

The interlock output pins 258, 260 connect through edge connector 102 to the system controller for providing the actual combined interlock outputs to the interlock receiving devices. A short circuit through pins 258, 260 indicates that the interlock output is okay, meaning that all of the combined interlock inputs are okay. On the other hand, an open circuit over pins 258, 260 indicates that the interlock output is not okay, meaning that at least one of the interlock inputs is not okay.

Lines 230–240 carry the combined output from the combination circuitry above. If for a given line 230–240, none of the interlock inputs had been selected or all of the selected interlock inputs had been okay, then voltage 204 would have been applied through the line. Otherwise, if any selected interlock input above the given line 230–240 had been not okay, then the line would have no voltage on it.

If a given line 230–240 presents voltage 204 to its respective relay 142, meaning that all of the above interlock inputs are either not selected or okay, then LED 134 is forward biased so a current flows through resistor 252, and diode 248 is reverse biased. The current through resistor 252 will cause a potential drop across the inductor 246, which will activate the switches 242, 244. Thus, if all of the combined interlock signals are okay, then pin 256 will present reference voltage 254 to the system controller, and pins 258 and 260 will be shorted, indicating that the interlock output is okay. Additionally, the forward biased LED 134 will turn on a green light providing a visual indicator to the operator that the interlock output is okay.

If a given line 230–240 does not present voltage 204, meaning that at least one of the above selected interlock inputs is not okay, as in the example given above, then it will provide an open circuit. In this case, reference voltage 254 will forward bias diode 248 and reverse bias LED 134. The forward biased diode 248 will effectively short out the inductor 246, so the switches 242, 244 will not be activated. Thus, when a selected interlock input is not okay, pin 256 will present no voltage to the system controller, and pins 258 and 260 will be open circuited, indicating that the interlock output is not okay. Additionally, the reverse biased LED 134 will not turn on, thus visually indicating to the operator that the interlock output is not okay.

Each wire 200 of each row R1–R8 is further connected through a diode 300 to a defeat circuit 302. Each defeat circuit 302 connects to a voltage source 304, such as +24V, and a reference voltage 306. Each defeat circuit 302 includes a jumper 126 of jumper bank 124 (FIG. 2) connected between the voltage source 304 and the diode 300. When the jumper 126 is not connected in the defeat circuit 302, then the defeat circuit 302 will have no effect because any voltage on wire 200 will reverse bias diode 300, causing the combination circuits to see an open circuit at that point. When the jumper 126 for a particular row R1–R8 is inserted into the defeat circuit 302, then the voltage source 304 will forward bias its diode 300 and be applied to the inductors 208 of the relays 118 of that row to activate each of the relay switches RS1, RS2 to pass voltage 204 through to the next row, regardless of the state of the corresponding wire 200. In other words, jumper 126 and voltage source 304 will cause their corresponding row to always pass through an interlock input okay signal whether the actual interlock input is okay or not okay. Thus, an operator can defeat the interlock input for any row R1–R8 when the corresponding jumper 126 is connected on PCB 100, thus effectively taking that interlock input out of the combination for all of the interlock outputs. In this manner, an operator of vacuum processing system 10 can troubleshoot a problem in the system or observe the function of a part of the system that would otherwise be obscured by the interlock if the interlock was permitted to operate normally.

Additionally, each jumper 308 connects its voltage source 304 to a yellow LED 156 and a resistor 310. Each LED 156 is connected in series with a resistor 312 to the reference voltage 306. Each resistor 310 is connected to a resistor 314 and the base of a transistor 316. Each resistor 314 and each emitter of the transistors 316 connect to the reference voltage 306. Each collector of the transistors 316 connects to a pin 318 for sending an output signal through edge connector 102. When the jumper 126 of a row R1–R8 is not connected in defeat circuit 302, then this part of the defeat circuit 302 has no effect, since it does not receive a voltage source. Thus, the yellow LED 156 does not light up, visually indicating to an operator that the corresponding interlock input is not defeated; and the transistor 316 is not turned on, so no signal is placed on the pin 318, indicating to the system controller that the interlock input is not defeated. When the jumper 126 of a particular row R1–R8 is connected in defeat circuit 302, however, then the yellow LED 156 is forward biased and will present a yellow light, indicating to the operator that the corresponding interlock input has been defeated; and the transistor 316 will turn on and pass the reference voltage 306 through to the pin 318, indicating to the system controller that the corresponding interlock input has been defeated.

While the foregoing is directed to the preferred embodiment of the present invention, other and further embodiments of the invention may be devised without departing from the basic scope thereof, and the scope thereof is determined by the claims which follow.

What is claimed is:

1. A vacuum processing system comprising:
   a first vacuum chamber;
   at least one second vacuum chamber attached to the first vacuum chamber;
   a plurality of parts of the vacuum processing system presenting individual interlock signals;
   a plurality of subsystems of the vacuum processing system receiving combined interlock signals; and
   an interlock circuit having at least one programmable circuit for selecting the individual interlock signals, combining the selected individual interlock signals, and generating at least one of the combined interlock signals;
   wherein:
   the at least one programmable circuit includes a plurality of combining switches;
   a first condition of one of the individual interlock signals causes a corresponding one of the plurality of combining switches to indicate an interlock-okay signal;
   a second condition of the one of the individual interlock signals causes the corresponding one of the plurality of combining switches to indicate an interlock-not-okay signal;
   the at least one programmable circuit includes an output switch;
   the plurality of combining switches causes the output switch to output the at least one of the combined interlock signals.

2. The vacuum processing system of claim 1 wherein one of the plurality of combining switches selects a corresponding one of the individual interlock signals when the one of the plurality of combining switches is off.

3. The vacuum processing system of claim 1 wherein:
   the at least one programmable circuit includes a plurality of selecting switches for selecting and deselecting the individual interlock signals to be combined into the at least one of the combined interlock signals; and
   only those of the plurality of combining switches that correspond to the individual interlock signals that are selected by the plurality of switches are combined to cause the output switch to output the at least one of the combined interlock signals.

4. The vacuum processing system of claim 1 wherein:
   the output switch outputs a combined interlock-okay signal when each one of the plurality of combining switches indicates an interlock-okay signal; and
   the output switch outputs a combined interlock-not-okay signal when any one of the plurality of combining switches indicates an interlock-not-okay signal.

5. A vacuum processing system comprising:
   a first vacuum chamber;
   at least one second vacuum chamber attached to the first vacuum chamber;
   a plurality of parts of the vacuum processing system presenting individual interlock signals;
   a plurality of subsystems of the vacuum processing system receiving combined interlock signals; and
   an interlock circuit having at least one programmable circuit for selecting the individual interlock signals, combining the selected individual interlock signals, and generating at least one of the combined interlock signals;
   wherein:
   the interlock circuit includes a plurality of defeat circuits;
   each of the individual interlock signals is associated with one of the plurality of defeat circuits; and
   each one of the plurality of defeat circuits is capable of preventing its associated one of the individual interlock signals from being combined with the selected individual interlock signals into any of the combined interlock signals.

6. The vacuum processing system of claim 5 wherein the defeat circuit is activated by setting a jumper.

7. The vacuum processing system of claim 5 wherein:
   the defeat circuit includes a visual indicator for indicating to an operator which of the individual interlock signals has been defeated.

8. A vacuum processing system comprising:
   a first vacuum chamber;
   at least one second vacuum chamber attached to the first vacuum chamber;
   a plurality of parts of the vacuum processing system presenting individual interlock signals;
   a plurality of subsystems of the vacuum processing system receiving combined interlock signals; and
   an interlock circuit having at least one programmable circuit for selecting the individual interlock signals, combining the selected individual interlock signals, and generating at least one of the combined interlock signals, wherein;
   the individual interlock signals each include two wires, the two wires shorted together indicating an interlock-okay signal, and the two wires not shorted together indicating an interlock-not-okay signal.

9. A vacuum processing system comprising:
   a first vacuum chamber;
   at least one second vacuum chamber attached to the first vacuum chamber;
   a plurality of parts of the vacuum processing system presenting individual interlock signals;
   a plurality of subsystems of the vacuum processing system receiving combined interlock signals; and
   an interlock circuit having at least one programmable circuit for selecting the individual interlock signals, combining the selected individual interlock signals, and generating at least one of the combined interlock signals, wherein;
   the combined interlock signals each include two wires, the two wires shorted together indicating an interlock-okay signal, and the two wires not shorted together indicating an interlock-not-okay signal.

10. A vacuum processing system comprising:
    a first vacuum chamber;
    at least one second vacuum chamber attached to the first vacuum chamber;
    a plurality of parts of the vacuum processing system presenting individual interlock signals;
    a plurality of subsystems of the vacuum processing system receiving combined interlock signals;
    an interlock circuit having at least one programmable circuit for selecting the individual interlock signals, combining the selected individual interlock signals, and generating at least one of the combined interlock signals, wherein;

the at least one programmable circuit includes a plurality of combing switches;

a first condition of one of the individual interlock signals causes a corresponding one of the plurality of combining switches to indicate an interlock-okay signal;

a second condition of the one of the individual interlock signals causes the corresponding one of the plurality of combining switches to indicate an interlock-not-okay signal;

the plurality of combining switches indicates an interlock-okay signal by closing a combination circuit; and the plurality of combining switches indicates an interlock-not-okay signal by opening the combination circuit;

whereby a voltage signal may be transferred through the combination circuit when each one of the plurality of combining switches closes the combination circuit, and the voltage signal is not transferred through the combination circuit when any one of the plurality of combining switches opens the combination circuit.

11. The vacuum processing system of claim 10 wherein:

the at least one programmable circuit includes an output switch;

the output switch is activated when the voltage signal is transferred through the combination circuit; and the output switch outputs the one of the combined interlock signals when activated.

12. The vacuum processing system of claim 11 wherein:

the combined interlock signals each include two wires;

the output switch shorts the two wires when activated;

the two wires shorted together indicates an interlock-okay signal; and the two wires not shorted together indicates an interlock-not-okay signal.

13. A vacuum processing system comprising:

a first vacuum chamber;

at least one second vacuum chamber attached to the fit vacuum chamber;

a plurality of parts of the vacuum processing system presenting individual interlock signals;

a plurality of subsystems of the vacuum processing system receiving combined interlock signals; and an interlock circuit having at least one programmable circuit for selecting the individual interlock signals, combining the selected individual interlock signals, and generating at least one of the combined interlock signals;

wherein the interlock circuit includes a plurality of visual indicators, each associated with one of the individual interlock signals, for indicating to an operator which of the individual interlock signals provide an interlock-okay signal.

14. A vacuum processing system comprising:

a first vacuum chamber;

at least one second vacuum chamber attached to the first vacuum chamber;

a plurality of parts of the vacuum processing system presenting individual interlock signals;

a plurality of subsystems of the vacuum processing system receiving combined interlock signals; and an interlock circuit having at least one programmable circuit for selecting the individual interlock signals, combining the selected individual interlock signals, and generating at least one of the combined interlock signals;

wherein the interlock circuit includes a plurality of visual indicators, each associated with one of the combined interlock signals, for indicating to an operator which of the combined interlock signals provide an interlock-okay signal.

15. A vacuum processing system for manufacturing integrated circuits comprising:

a first vacuum chamber;

at least one second vacuum chamber attached to the first vacuum chamber;

at least one part of either the vacuum processing system or the at least one second vacuum chamber being for providing an interlock signal;

a programmable interlock circuit comprising:
two input lines activated by the interlock signal;
a select switch for selecting the interlock signal;
two output lines; and
a circuit activated by the input lines and for controlling the two output lines, the circuit short-circuiting the two output lines together when the two input lines are short-circuited together, and open-circuiting the two output lines when the two input lines are open circuited and the select switch has selected the interlock signal.

16. A method of providing interlock signals in a vacuum processing system comprising the steps of:

selecting from a plurality of interlock input signals one or more interlock input signals to be combined by a programmable interlock circuit for each one of a plurality of interlock output signals;

generating the plurality of interlock input signals by a first plurality of parts of the vacuum processing system;

receiving the plurality of interlock input signals by the programmable interlock circuit;

combining the selected one or more interlock signals for each one of the plurality of interlock output signals;

generating the plurality of interlock output signals by the programmable interlock circuit; and receiving the plurality of interlock output signals by a second plurality of parts of the vacuum processing system;

wherein the selecting step includes the further step of activating a switch for each of the one or more interlock input signals for each one of the plurality of output signals in an m×n matrix of switches, wherein m is the number of the plurality of interlock input signals, and n is the number of the plurality of interlock output signals;

whereby 1 to m interlock input signals may be combined to form each of 1 to n interlock output signals.

* * * * *

UNITED STATES PATENT AND TRADEMARK OFFICE
CERTIFICATE OF CORRECTION

PATENT NO. : 6,086,676
DATED : July 11, 2000
INVENTOR(S) : Kao et al.

It is certified that error appears in the above-identified patent and that said Letters Patent is hereby corrected as shown below:

Column 13,
Line 5, please replace "combing" with "combining".
Line 42, please replace "fit" with "first".

Signed and Sealed this

Twenty-fifth Day of September, 2001

Attest:

*Attesting Officer*

NICHOLAS P. GODICI
*Acting Director of the United States Patent and Trademark Office*